United States Patent
Ahn et al.

(10) Patent No.: US 11,450,394 B2
(45) Date of Patent: Sep. 20, 2022

(54) CONTROLLER AND OPERATING METHOD THEREOF

(71) Applicants: SK hynix Inc., Gyeonggi-do (KR); Industry-Academic Cooperation Foundation, Yonsei University, Seoul (KR)

(72) Inventors: Soo Hong Ahn, Gyeonggi-do (KR); Eui Young Chung, Seoul (KR); Young Min Park, Seoul (KR)

(73) Assignees: SK hynix Inc., Gyeonggi-do (KR); Industry-Academic Cooperation Foundation, Yonsei University, Seoul (KR)

(*) Notice: Subject to any disclaimer, the term of this patent is extended or adjusted under 35 U.S.C. 154(b) by 0 days.

(21) Appl. No.: 17/003,232

(22) Filed: Aug. 26, 2020

(65) Prior Publication Data
US 2021/0074373 A1    Mar. 11, 2021

(30) Foreign Application Priority Data

Sep. 11, 2019 (KR) .......... 10-2019-0112907
Jul. 31, 2020 (KR) .......... 10-2020-0095883

(51) Int. Cl.
| | | |
|---|---|---|
| *G11C 16/06* | (2006.01) | |
| *G11C 16/34* | (2006.01) | |
| *G11C 16/26* | (2006.01) | |
| *G06F 3/06* | (2006.01) | |
| *G11C 16/10* | (2006.01) | |

(52) U.S. Cl.
CPC ........ *G11C 16/3495* (2013.01); *G06F 3/0614* (2013.01); *G06F 3/0647* (2013.01); *G06F 3/0679* (2013.01); *G11C 16/10* (2013.01); *G11C 16/26* (2013.01)

(58) Field of Classification Search
CPC ..... G11C 16/3495; G11C 16/10; G11C 16/26; G11C 13/0023; G11C 13/0035; G11C 29/52; G11C 16/349; G11C 11/005; G11C 13/0004; G06F 3/0679; G06F 3/061; G06F 3/0649; G06F 12/0246; G06F 2212/7211; G06F 3/0647; G06F 3/0644; G06F 3/0614
See application file for complete search history.

(56) References Cited

U.S. PATENT DOCUMENTS 8,601,202 B1 * 12/2013 Melcher .............. G11C 16/349
                                                      711/103
2004/0193806 A1 * 9/2004 Koga ................... G06F 12/121
                                                      711/133

FOREIGN PATENT DOCUMENTS

| KR | 10-2010-0040426 | 4/2010 |
| KR | 10-1146082 | 5/2012 |
| KR | 10-1651384 | 8/2016 |
| KR | 10-2018-0003692 | 1/2018 |

* cited by examiner

*Primary Examiner* — Uyen Smet
(74) *Attorney, Agent, or Firm* — IP & T Group LLP

(57) ABSTRACT

A controller that controls a nonvolatile memory apparatus may include a first memory configured to temporarily store user data, a second memory including a plurality of memory regions composed of one or more meta regions for storing meta data and at least one spare region, and a processor configured to control the first memory and the second memory and perform first start-gap wear leveling on at least one meta region using the at least one spare region as a gap.

15 Claims, 15 Drawing Sheets

FIG.4A

| sub region_01 | meta data_01 |
| --- | --- |
| sub region_02 | meta data_02 |
| sub region_03 | meta data_03 |
| sub region_04 | meta data_04 |
| sub region_05 | meta data_05 |
| sub region_06 | meta data_06 |
| sub region_07 | meta data_07 |
| sub region_08 | meta data_08 |
| sub region_09 | meta data_09 |
| sub region_10 | Gap(spare) |

FIG.4B

| sub region_01 | meta data_01 |
| --- | --- |
| sub region_02 | meta data_02 |
| sub region_03 | meta data_03 |
| sub region_04 | meta data_04 |
| sub region_05 | meta data_05 |
| sub region_06 | meta data_06 |
| sub region_07 | meta data_07 |
| sub region_08 | meta data_08 |
| sub region_09 | Gap(spare) |
| sub region_10 | meta data_09 |

FIG.4C

| sub region_01 | meta data_01 |
| --- | --- |
| sub region_02 | meta data_02 |
| sub region_03 | meta data_03 |
| sub region_04 | meta data_04 |
| sub region_05 | meta data_05 |
| sub region_06 | meta data_06 |
| sub region_07 | meta data_07 |
| sub region_08 | Gap(spare) |
| sub region_09 | meta data_08 |
| sub region_10 | meta data_09 |

FIG.5A

| memory region_01 | |
|---|---|
| sub region_01 | meta data_01 |
| sub region_02 | meta data_02 |
| sub region_03 | meta data_03 |
| sub region_04 | meta data_B |
| sub region_05 | meta data_05 |
| sub region_06 | meta data_06 |
| sub region_07 | meta data_07 |
| sub region_08 | meta data_08 |
| sub region_09 | meta data_09 |

| memory region_02 | |
|---|---|
| sub region_01 | meta data_01 |
| sub region_02 | meta data_C |
| sub region_03 | meta data_03 |
| sub region_04 | meta data_04 |
| sub region_05 | meta data_05 |
| sub region_06 | meta data_06 |
| sub region_07 | meta data_07 |
| sub region_08 | meta data_08 |
| sub region_09 | meta data_09 |

| memory region_03 | |
|---|---|
| sub region_01 | meta data_A |
| sub region_02 | meta data_02 |
| sub region_03 | meta data_03 |
| sub region_04 | meta data_04 |
| sub region_05 | meta data_05 |
| sub region_06 | meta data_06 |
| sub region_07 | meta data_07 |
| sub region_08 | meta data_08 |
| sub region_09 | meta data_09 |

FIG.5B

| memory region_01 | |
|---|---|
| sub region_01 | meta data_01 |
| sub region_02 | meta data_02 |
| sub region_03 | meta data_03 |
| sub region_04 | invalid |
| sub region_05 | meta data_05 |
| sub region_06 | meta data_06 |
| sub region_07 | meta data_07 |
| sub region_08 | meta data_08 |
| sub region_09 | meta data_09 |

| memory region_02 | |
|---|---|
| sub region_01 | meta data_01 |
| sub region_02 | invalid |
| sub region_03 | meta data_03 |
| sub region_04 | meta data_04 |
| sub region_05 | meta data_05 |
| sub region_06 | meta data_06 |
| sub region_07 | meta data_07 |
| sub region_08 | meta data_08 |
| sub region_09 | meta data_09 |

| memory region_03 | |
|---|---|
| sub region_01 | meta data_A |
| sub region_02 | meta data_B |
| sub region_03 | meta data_C |
| sub region_04 | empty |
| sub region_05 | empty |
| sub region_06 | empty |
| sub region_07 | empty |
| sub region_08 | empty |
| sub region_09 | empty |

FIG.6A

| memory region_01 | |
|---|---|
| sub region_01 | meta data_A |
| sub region_02 | meta data_B |
| sub region_03 | meta data_C |
| sub region_04 | empty |
| sub region_05 | empty |
| sub region_06 | empty |
| sub region_07 | empty |
| sub region_08 | empty |
| sub region_09 | empty |

FIG.6B

| memory region_02 | |
|---|---|
| sub region_01 | empty |
| sub region_02 | empty |
| sub region_03 | empty |
| sub region_04 | meta data_A |
| sub region_05 | meta data_B |
| sub region_06 | meta data_C |
| sub region_07 | empty |
| sub region_08 | empty |
| sub region_09 | empty |

CONTROLLER AND OPERATING METHOD THEREOF

CROSS-REFERENCES TO RELATED APPLICATION

The present application claims priority under 35 U.S.C. § 119(a) to Korean application number 10-2019-0112907, flied on Sep. 11, 2019, and 10-2020-0095883, filed on Jul. 31, 2020 in the Korean Intellectual Property Office, which is incorporated herein by reference in its entirety.

BACKGROUND

1. Technical Field

Various embodiments generally relate to a semiconductor apparatus, and more particularly, to a controller and an operating method thereof.

2. Related Art

Recently, a paradigm for a computer environment has been changed to ubiquitous computing which enables a computer system to be used virtually anytime and anywhere. Therefore, the use of portable electronic devices such as cellular phones, digital cameras, and notebook computers is rapidly increasing. Such portable electronic devices generally use a memory system using a memory apparatus. The memory system is used to store data used in the portable electronic devices.

The memory system using the memory apparatus is advantageous in that stability and durability are superior due to the absence of a mechanical driving unit, an information access speed is very fast, and power consumption is small. The memory system having such advantages may include a universal serial bus (USB) memory apparatus, a memory card having various interfaces, a universal flash storage (UFS) device, and a solid state drive (SSD).

SUMMARY

In an embodiment, a controller that controls a nonvolatile memory apparatus may include: a first memory configured to temporarily store user data; a second memory including a plurality of memory regions composed of one or more meta regions for storing meta data and at least one spare region; and a processor configured to control the first memory and the second memory and perform first start-gap wear leveling on at least one meta region using the at least one spare region as a gap.

In an embodiment, an operating method of a controller, which includes a first memory configured to temporarily store user data and a second memory including a plurality of memory regions composed of one or more meta regions for storing meta data and at least one spare region, the operating method comprising: determining, by the controller, whether a number of accesses to at least one meta region, where the meta data is stored, is equal to or greater than a first reference value; and performing, by the controller, first start-gap wear leveling on at least one meta region using the at least one spare region as a gap, when a total sum of the number of accesses to the meta data is equal to or more than a first reference value.

In an embodiment, a system may include: a data memory region having one or more data spaces each configured to store a data piece; a spare memory region having one or more spare spaces each configured to store a data piece; and a controller configured to: shift first data pieces stored in one or more among the data spaces for the first data pieces to flock within the data memory region, a number of accesses to each of the first pieces being a first threshold or greater, and migrate a second data piece from one among the data space to the spare memory region, a number of accesses to the second piece being a second threshold or greater. The data memory region includes a cold data region and a hot data region, and the controller is further configured to shift a third data pieces in which the number of accesses is equal to or more than the third reference value among the data spaces to flock within to the hot data region, when it is detected that a total sum of the number of accesses to the data memory region is less than a first reference value.

BRIEF DESCRIPTION OF THE DRAWINGS

FIGS. 2, 3A to 3C, 4A to 4C, 5A and 5B, 6A to 6C are diagrams for describing a start-gap wear leveling operation of a second memory in accordance with an embodiment of the present disclosure.

FIG. 7 and FIG. 8 are flowcharts for describing a start-gap wear leveling operation of the second memory in accordance with an embodiment of the present disclosure.

DETAILED DESCRIPTION

Hereinafter, a controller and an operating method thereof will be described below with reference to the accompanying drawings through various examples of embodiments.

Figure 1:
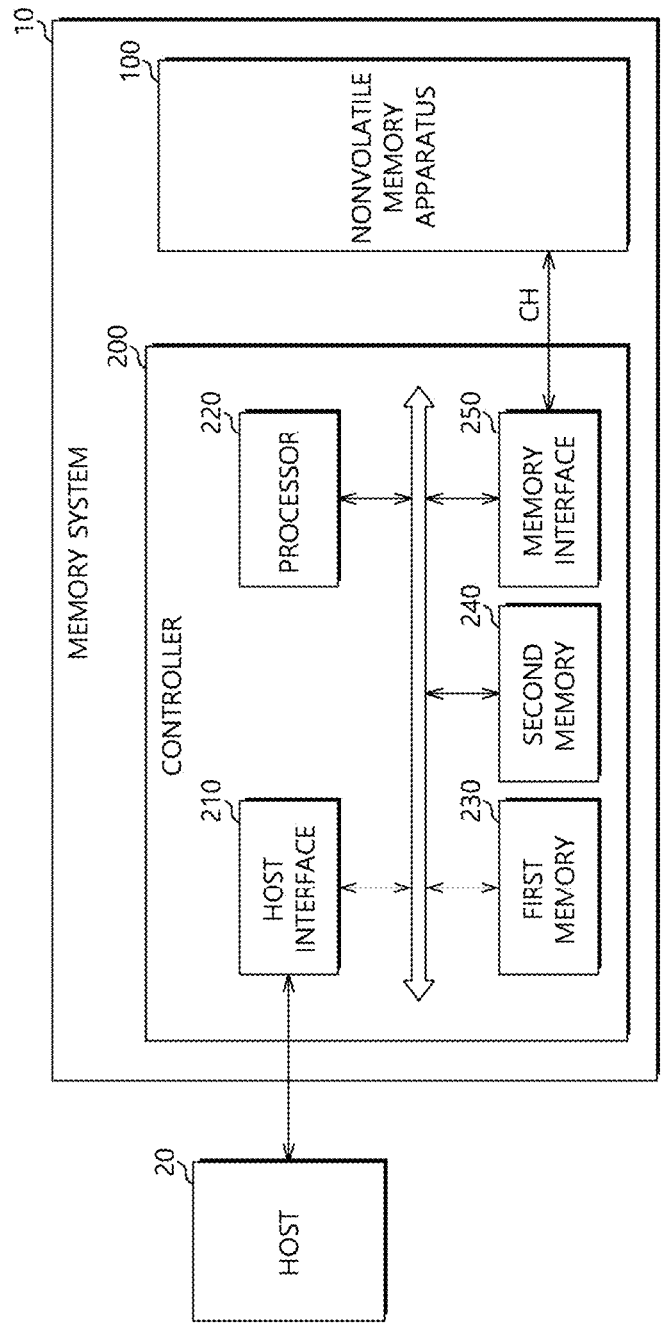
FIG. 1 is a diagram illustrating a configuration of a memory system in accordance with an embodiment of the present disclosure.

FIG. 1 is a diagram illustrating a configuration of a memory system 10 in accordance with an embodiment.

Referring to FIG. 1, the memory system 10 in accordance with an embodiment may store data which is accessed by a host 20 such as a cellular phone, an MP3 player, a laptop computer, a desktop computer, a game machine, a television, an in-vehicle infotainment system.

The memory system 10 may be fabricated as any one of various types of storage devices according to an interface protocol electrically connected to the host 20. For example, the memory system 10 may be configured as any one of various types of storage devices such as a multimedia card in the form of a solid state drive (SSD), an MMC, an eMMC, an RS-MMC, or a micro-MMC, a secure digital card in the form of an SD, a mini-SD, or a micro-SD, a universal serial bus (USB) storage device, a universal flash storage (UFS) device, a storage device in the form of a personal computer memory card international association (PCMCIA) card, a storage device in the form of a peripheral component interconnection (PCI) card, a storage device in the form of a PCI express (PCI-E) card, a compact flash (CF) card, a smart media card, and a memory stick.

The memory system 10 may be fabricated as any one of various types of packages. For example, the memory system 10 may be fabricated as any one of various types of packages such as a package on package (POP), a system in package (SIP), a system on chip (SOC), a multi-chip package (MCP), a chip on board (COB), a wafer-level fabricated package (WFP), and a wafer-level stack package 2s (WSP).

The memory system 10 may include a nonvolatile memory apparatus 100 and a controller 200.

The nonvolatile memory apparatus 100 may operate as a storage medium of the memory system 10. The nonvolatile memory apparatus 100 may be configured as any one of various types of nonvolatile memory apparatuses, such as a NAND flash memory apparatus, a NOR flash memory apparatus, a ferroelectric random access memory (FRAM) using a ferroelectric capacitor, a magnetic random access memory (MRAM) using a tunneling magneto-resistive (TMR) film, a phase change random access memory (PRAM) using chalcogenide alloys, and a resistive random access memory (ReRAM) using a transition metal oxide, according to the type of memory cells.

FIG. 1 illustrates that the memory system 10 includes one nonvolatile memory apparatus 100. However, this is for convenience of description, and the memory system 10 may include a plurality of nonvolatile memory apparatuses and an embodiment can also be equally applied to the memory system 10 including a plurality of nonvolatile memory apparatuses.

The nonvolatile memory apparatus 100 may include a memory cell array (not illustrated) having a plurality of memory cells arranged in intersection areas of a plurality of bit lines (not illustrated) and a plurality of word lines (not illustrated). The memory cell array may include a plurality of memory blocks and each of the plurality of memory blocks may include a plurality of pages.

Each memory cell of the memory cell array may operate as a single level cell (SLC) that stores one bit of data or a multi-level cell (XLC) capable of storing two or more bits of data. The multi-level cell (MLC) may store two bits of data, three bits of data, four bits of data and the like. In general, a memory cell that stores two bits of data is called a multi-level cell (MLC), a memory cell that stores three bits of data is called a triple level cell (TLC), and a memory cell that stores four bits of data is called a quad level cell (QLC). However, in the present embodiment, for convenience of description, a memory cell that stores two or more bits of data will be generally called a multi-level cell (XLC).

The memory cell array may include at least one of the single level cell (SLC) and the multi-level cell (XLC). Furthermore, the memory cell array may also include memory cells having a two-dimensional horizontal structure or memory cells having a three-dimensional vertical structure.

The controller 200 may control all operations of the memory system 10 by driving firmware or software loaded on a first memory 230. The controller 200 may decode and drive a code type instruction or an algorithm such as firmware or software. The controller 200 may be implemented as hardware or a combination of hardware and software.

The controller 200 may include a host interface 210, a processor 220, the first memory 230, a second memory 240, and a memory interface 250. Although not illustrated in FIG. 1, the controller 200 may further include an error correction code (ECC) engine that generates a parity code by ECC-encoding write data provided from the host 20 and ECC-decodes read-data read from the nonvolatile memory apparatus 100 by using the parity code.

The host interface 210 may serve as an interface between the host 20 and the memory system 10 in correspondence to the protocol of the host 20. For example, the host interface 210 may communicate with the host 20 through any one of protocols such as a universal serial bus (USB), a universal flash storage (UFS), a multimedia card (MMC), a parallel advanced technology attachment (PATA), a serial advanced to technology attachment (SATA), a small computer system interface (SCSI), a serial attached SCSI (SAS), a peripheral component interconnection (PCI), and a PCI express (PCI-E).

The processor 220 may be configured in the form of a micro control unit (MCU) or a central processing unit (CPU). The processor 220 may process requests transmitted from the host 20. In order to process the requests transmitted from the host 20, the processor 220 may drive the code type instruction or algorithm loaded on the first memory 230, that is, the firmware, and control internal function blocks such as the host interface 210, the first memory 230, the second memory 240, and the memory interface 250, and the nonvolatile memory apparatus 100.

The processor 220 may generate control signals for controlling the operation of the nonvolatile memory apparatus 100 on the basis of the requests transmitted from the host 20, and provide the generated control signals to the nonvolatile memory apparatus 100 through the memory interface 250.

The first memory 230 may store user data, and used as a region, which is used as a command queue (CMDQ) for queuing a command corresponding to the request provided from the host 20, a write data buffer where write data is temporarily stored, and a read data buffer where read data is temporarily stored. User data may be stored in the second memory 240 too.

In an embodiment, the first memory 230 may be composed of a random access memory such as a dynamic random access memory (DRAM) or a static random access memory (SRAM).

In an embodiment, the first memory 230 may have a higher integration than the second memory 240. That is, the first memory 230 may have a larger data storage capacity than the second memory 240.

In an embodiment, the first memory 230 may have a higher data throughput than the second memory 240, and thus may operate at a higher speed than the second memory 240.

The second memory 240 may store the firmware that is driven by the processor 220. Furthermore, the second memory 240 may store data required for driving the firmware, for example, meta data. That is, the second memory 240 may operate as a working memory of the processor 220. Furthermore, the second memory 240 may serve as a map cache buffer in which map data is cached.

In an embodiment, the second memory 240 may be composed of a memory such as a phase change RAM (PCRAM).

The memory interface 250 may control the nonvolatile memory apparatus 100 under the control of the processor 220. The memory interface 250 may be called a memory controller. The memory interface 250 may provide the control signals to the nonvolatile memory apparatus 100. The control signals may include a command, an address and the like for controlling the nonvolatile memory apparatus 100. The memory interface 250 may provide the nonvolatile memory apparatus 100 with the data stored in the data buffer, or may store the data transmitted from the nonvolatile memory apparatus 100 in the data buffer. The data buffer may be a region assigned to the first memory 230.

Figure 2:
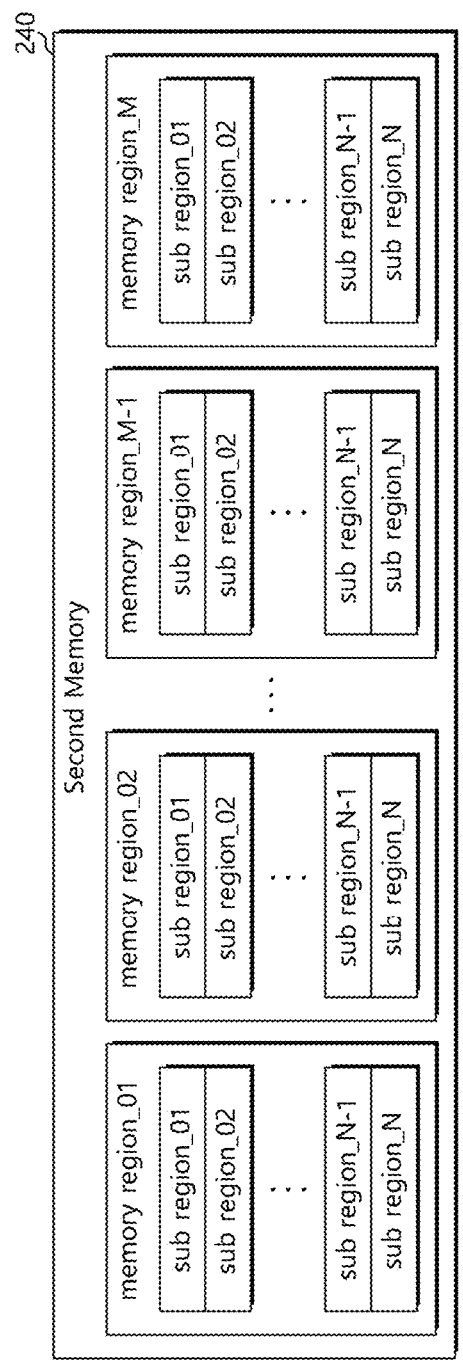

FIG. 2 is a diagram for describing the second memory 240 illustrated in FIG. 1.

The second memory 240 may temporarily store user data to be stored in the nonvolatile memory apparatus 100 or store meta data used to manage the nonvolatile memory apparatus 100. The second memory 240 may include a plurality of memory regions "memory region_01" to "memory region_M" in order to store the user data and the meta data, and each of the memory regions "memory region_01" to "memory region_M" may be composed of a plurality of sub-regions "sub region_01" to "sub region_N".

In an embodiment, the plurality of memory regions "memory region_01" to "memory region_M" included in the second memory 240 may include meta regions and at least one spare region used as a gap for performing a start-gap wear leveling operation.

In another embodiment, the sub-regions "sub region_01" to "sub region_N" included in each of the plurality of memory regions included in the second memory 240 may include sub-meta regions for storing meta data and at least one sub-spare region used as a gap for performing the start-gap wear leveling operation.

In an embodiment, each of the plurality of memory regions "memory region_01" to "memory region_M" included in the second memory 240 may include a cold meta region storing meta data having a number of accesses smaller than a first reference value and a hot meta region storing meta data having a number of accesses equal to or more than the first reference value. Furthermore, the first reference value may be set or changed during the fabrication or use of the memory system 10. In an embodiment, the first reference value may be a reference value for classifying the memory region into the hot meta region and the cold meta region.

Figure 3A:
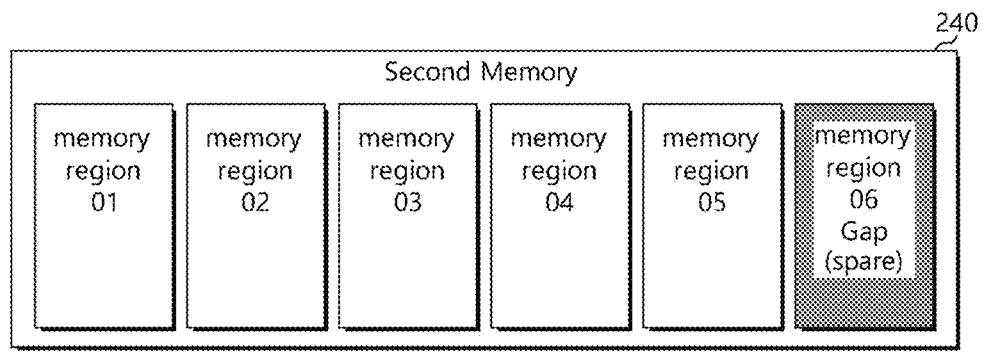
Figure 3B:
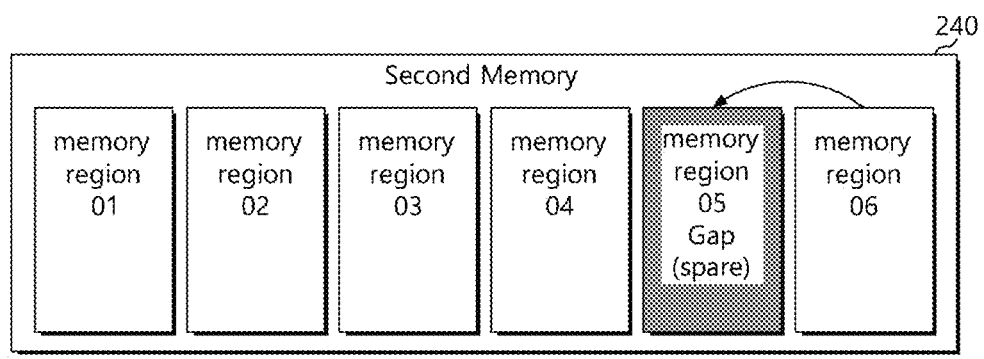
Figure 3C:
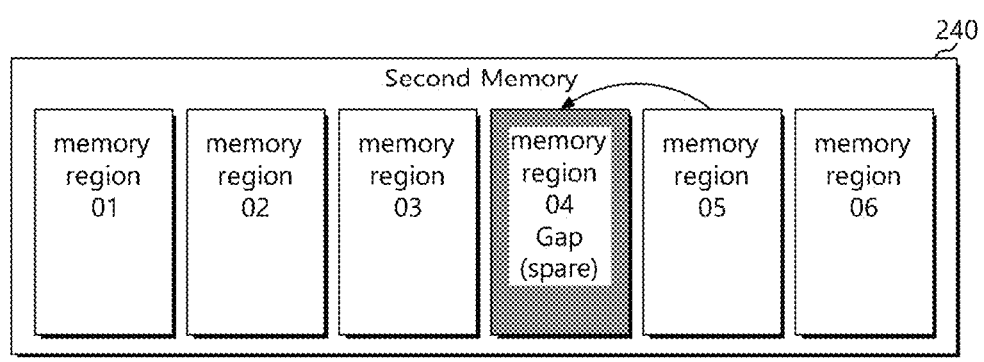

FIGS. 3A to 3C are diagrams for describing start-gap wear leveling of the second memory in accordance with an embodiment of the present disclosure.

Referring to FIG. 3A, the second memory 240 may include, for example, six memory regions "memory region_01" to "memory region_06". Among the six memory regions, the five memory regions "memory region_01" to "memory region_05" may be meta regions for storing meta data and the remaining memory region "memory region_06" may be a spare region. In such a case, it is assumed that the memory region 05 "memory region_05" of the memory regions "memory region_01" to "memory region_05" is a memory region where a start-gap wear leveling operation is to be started and the memory region 06 "memory region_06" is a gap region.

Referring to FIG. 3B, when a total sum of the numbers of accesses to the meta data stored in the memory regions "memory region_01" to "memory region_05" is equal to or greater than the first reference value, the controller 200 may start the start-gap wear leveling operation. For example, the controller 200 may migrate the meta data stored in the memory region 05 "memory region_05", where the start-gap wear leveling operation is to be started, to the memory region 06 "memory region_06" which is the gap region. As a result of the start-gap wear leveling operation, the memory region 05 "memory region_05" may be switched to a spare region and the memory region 06 "memory region_06" may be switched to a meta region. Furthermore, the memory region 04 "memory region_04" may be selected as a meta region on which a subsequent start-gap wear leveling operation is to be started, and the memory region "memory region_05" may be selected as a gap region for the subsequent start-gap wear leveling operation.

That is, by sequentially decreasing or increasing an address of the memory region 05 "memory region_05" where the start-gap wear leveling operation is to be started or calculating the address of the memory region 05 "memory region_05" through a set address calculation formula, one (e.g., the memory region 04 "memory region_04") of the remaining memory regions "memory region_01" to "memory region_04", except for a memory region (e.g., the memory region 05 "memory region_05") where the start-gap wear leveling has already been performed thus became the gap region, may be selected as a target meta region on which a subsequent start-gap wear leveling operation is to be started, and one (e.g., the memory region 05 "memory region_05") of the memory regions where the start-gap wear leveling operations have already been performed may be selected as a gap region for the subsequent start-gap wear leveling operation.

Referring to FIG. 3C, the controller 200 may migrate the meta data, which is stored in the memory region 04 "memory region_04" as the target meta region of the start-gap wear leveling operation, to the gap region, that is, the memory region 05 "memory region_05" as the gap region. Accordingly, the memory region 04 "memory region_04" may be switched to a spare region (i.e., a gap region) for a subsequent start-gap wear leveling operation and the memory region 05 "memory region_05" may become a target meta region for the subsequent start-gap wear leveling operation. Furthermore, a subsequent start-gap wear leveling operation may be performed on the memory region 03 "memory region_03", and the memory region 04 "memory region_04" may be a gap region for the subsequent start-gap wear leveling operation.

FIGS. 3A to 3C illustrate an example in which the start-gap wear leveling operation is performed by selecting the addresses of the memory regions "memory region_01" to "memory region_05" to become the spare regions in descending order. However, the present disclosure is not limited thereto, and various changes and modifications may be made, such as using two or more spare regions as gaps or performing the start-gap wear leveling operation by selecting the addresses of the spare regions in ascending order.

Since the start-gap wear leveling illustrated in FIGS. 3A to 3C is performed on the basis of the total sum of the number of accesses to the meta data stored in the memory regions "memory region_01" to "memory region_05", it may be referred to as a global start-gap wear leveling.

FIGS. 4A to 4C are diagrams for describing a start-gap wear leveling method of the second memory in accordance with an embodiment, and illustrates a start-gap wear leveling for a sub-region.

FIG. 4A illustrates an example of a memory region including 10 sub-regions "sub region_01" to "sub region_10". Within the memory region, each of the 10 sub-regions "sub region_01" to "sub region_10" may respectively include sub-meta regions that store meta data "meta data_01" to "meta data_09" and a spare region Gap (spare). It is assumed that the sub-region "sub region_09" among the plurality of sub-regions "sub region_01" to "sub region_10" is a sub-region where a start-gap wear leveling operation is to be started and the sub-region "sub region_10" is a gap region.

Referring to FIG. 4B, when a total sum of the number of accesses to the meta data stored in the sub-regions "sub region_01" to "sub region_09" is equal to or greater than a second reference value, the controller 200 may start the start-gap wear leveling operation. For example, the controller 200 may migrate the meta data "meta data_09" stored in the sub-region "sub region_09", where the start-gap wear leveling operation is to be started, to the sub-region "sub region_10". Accordingly, the sub-region "sub region_09" may be switched to a gap (spare) for a subsequent start-gap wear leveling operation and the sub-region "sub region_08" may be a target sub-meta region of the subsequent start-gap wear leveling operation. In an embodiment, the second reference value may be set or changed during the fabrication or use of the memory system 10.

That is, by sequentially decreasing or increasing an address of the sub-region 09 "sub region_09" where the start-gap wear leveling operation is to be started or calculating the address of the sub-region 09 "sub region_09" through a set address calculation formula, one (e.g., the sub-region 08 "sub region_08") of the remaining sub-regions "sub region_01" to "sub region_08", except for a sub-region (e.g., the sub-region 09 "sub region_09") where the start-gap wear leveling has already been performed and thus became the gap region, may be selected as a target meta region of the subsequent start-gap wear leveling operation, and one (e.g., the sub region 09 "sub region_09") of the sub-regions where the start-gap wear leveling operations have already been performed may be selected as a gap region for the subsequent start-gap wear leveling operation.

Referring to FIG. 4C, the controller 200 may migrate meta data "meta data 08", which is stored in the sub-region "sub region_08" as the target sub-region of the start-gap wear leveling operation, to the sub-region "sub region_9" as the gap region. Accordingly, the sub-region "sub region_08" may be selected as a gap region for a subsequent start-gap wear leveling operation and the sub-region "sub region_07" may become a target sub-region for the subsequent start-gap wear leveling operation.

FIGS. 4A to 4C illustrate an example of the start-gap wear leveling operation is performed by selecting the addresses of the sub-regions "sub region_01" to "sub region_09" in descending order. However, the present disclosure is not limited thereto, and various changes and modifications may be made, such as selecting two or more sub-regions as gaps or selecting the addresses of the sub-regions in ascending order.

Since the start-gap wear leveling illustrated in FIGS. 4A to 4B is performed on the basis of the total sum of the number of accesses to the meta data stored in the sub-regions "sub region_01" to "sub region_09" for each of the memory regions "memory region_01" to "memory region_05", it may be referred to as a local start-gap wear leveling.

FIG. 5A to FIG. 6C are diagrams for describing a start-gap wear leveling method of the second memory in accordance with an embodiment.

FIG. 5A to FIG. 6C illustrate three memory regions "memory region_01" to "memory region_03" among the plurality of memory regions "memory region_01" to "memory region_M" of the second memory 240. Each of the memory regions "memory region_01" to "memory region_03" may include 9 sub-regions "sub region_01" to "sub region_09". Hereinafter, a description will be given for a case where the memory region "memory region_01" and the memory region "memory region_02" are cold meta regions for storing meta data having the number of accesses less than the first reference value and the memory region "memory region_03" includes at least one sub-spare region. FIG. 5A illustrates a case where the memory region "memory region_03" includes one sub-meta region "sub region_01" and eight sub-spare regions "sub region_02" to "sub region_09" and 1o meta data "meta data_A" accessed by a third reference value or more is stored in the sub-meta region "sub region_01"; however, the present disclosure is not limited thereto and the memory region "memory region_03" may also be composed of only sub-spare regions.

In such a case, a method of collecting hot data in the cold meta regions "memory region_01" and "memory region_02" into another memory region 03 "memory region_03" will be described.

Hot data may refer to data that is accessed continuously and frequently. Accordingly, a sub-region where access is continuously concentrated among sub-regions included in a specific memory region may be determined as a region storing hot meta data. In an embodiment, a sub-region where the number of accesses to the sub-region for each memory region is equal to or more than the third reference value may be determined as a hot region. In order to determine whether the third reference value is satisfied, when a memory region, where the total sum of the number of accesses is equal to or greater than a first set value, is detected, it may be checked whether the number of accesses to a specific sub-region in the memory region is equal to or more than the third reference value (=first set value*$\alpha$, $\alpha$ is a real number where $0<\alpha<1$). Here, $\alpha$ may be set or changed during the fabrication or use of the memory system 10 according to hot data classification criteria.

For example, when the first set value is 10,000 and a is 0.6, meta data in a sub-region where the number of accesses is equal to or more than 6,000 which is the third reference value may be classified as hot data.

When the total sum of the number of accesses to the memory region 01 "memory region_01" is 10,000 and the number of accesses to meta data "meta data_B" stored in the sub-region 04 "sub region_04" is 6,000, the number of accesses to the remaining sub-regions "sub region_01" to "sub region_03" and sub-regions "sub region_05" to "sub region_09", except for the sub-region 04 "sub region_04", is 4,000. Thus, the meta data "meta data_B" stored in the sub-region 04 "sub region_04" may be classified into hot data.

Referring to FIG. 5A, when the number of accesses to the meta data B "meta data_B" stored in the sub-region 04 "sub region_04" of the memory region 01 "memory region_01" and the number of accesses to meta data C "meta data_C" stored in the sub-region "sub region_02" of the memory region "memory region_02" are each equal to or greater than the third reference value, the controller 200 may determine that the meta data B "meta data_B" and the meta data C "meta data_C" as targets to be migrated to the memory region "memory region_03".

In FIG. 5B, the controller 200 may migrate the meta data B "meta data_B" stored in the sub-region "sub region_04" of the memory region "memory region_01" to the sub-region "sub region_02" of the memory region "memory region_03", and release the sub-region "sub region_04" of the memory region "memory region_01". Furthermore, the controller 200 may migrate the meta data "meta data_C" stored in the sub-region "sub region_02" of the memory region "memory 1o region_02" to the sub-region "sub region_03" of the memory region "memory region_03", and release the sub-region "sub region_02" of the memory region "memory region_02".

Through such a migration operation, hot meta data, on which a write or read operation is frequently performed, may be collected in one memory region 03 "memory region_03" to make the memory region 03 "memory region_03" a hot meta region.

Referring to FIG. 6A, when the total sum of the number of accesses to meta data stored in the sub-regions "sub region_01" to "sub region_09" in the memory region 03 "memory region_03", which is the hot meta region, is equal to or more than the second reference value, the local start-gap wear leveling may be started. In such a case, it is assumed that the sub-regions "sub region_01" to "sub region_03" are target sub-regions where the start-gap wear leveling operation is to be started, and the sub-regions "sub region_04" to "sub region_06" are gap regions.

Referring to FIG. 6B, the controller 200 may migrate the meta data "meta data_A" to "meta data_C" stored in the respective sub-regions "sub region_01" to "sub region_03" to the respective sub-regions "sub region_04" to "sub region_06". Then, the controller 200 may determine that the sub-regions "sub region_04" to "sub region_06" of the memory region "memory region_03" as target sub-regions of a subsequent start-gap wear leveling operation, and determine the sub-regions "sub region_07" to "sub region_09" as gap regions for the subsequent start-gap wear leveling operation.

Figures 6C, 7:
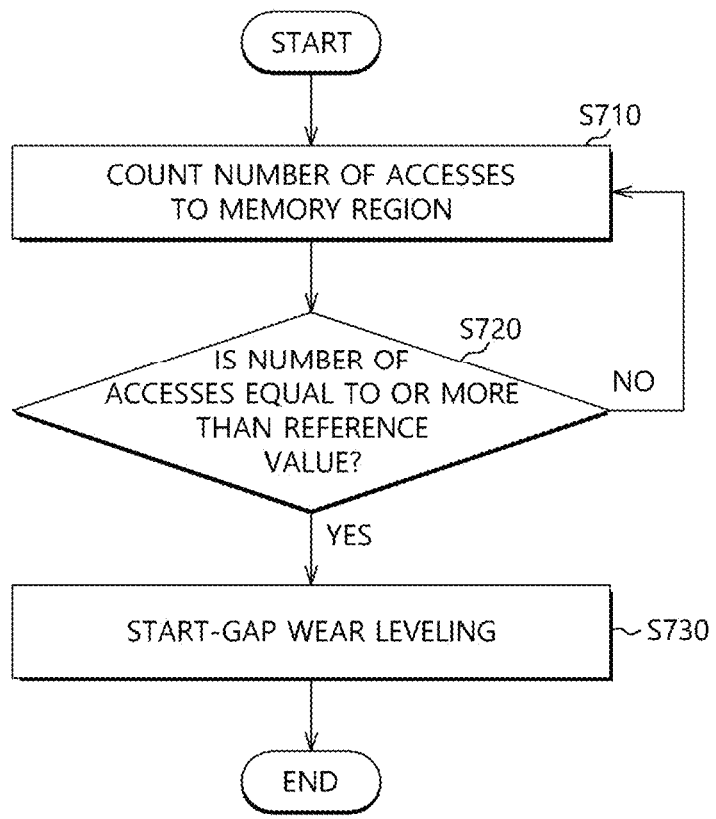

Referring to FIG. 6C, the controller 200 may migrate the meta data "meta data_A" to "meta data_C" stored in the respective sub-regions "sub region_04" to "sub region_06" to the respective sub-regions "sub region_07" to "sub region_09".

According to various embodiments of the present disclosure, the lifespan of the second memory 240 may be increased by performing the wear leveling operation on meta data having the relatively high number of accesses.

On the other hand, when the total sum of the number of accesses to the meta data stored in the memory regions "memory region_01" to "memory region_M" is equal to or more than the first reference value, the controller 200 may start the global start-gap wear leveling operation.

FIG. 7 is a flowchart for describing the start-gap wear leveling operation of the second memory in accordance with an embodiment.

Referring to FIG. 7, in operation S710, the controller 200 may count the number of accesses to meta data stored in the second memory 240.

In an embodiment, the controller 200 may count the number of accesses to meta data included in each memory region, where the start-gap wear leveling operation is to be performed, among a plurality of memory regions included in the second memory 240.

In an embodiment, the controller 200 may count the total sum of the number of accesses to meta data stored in each of the sub-regions (e.g., "sub region_01" to "sub region_09") for each memory 1o regions (e.g., "memory region_01" to "memory region_M"), and the total sum of the number of accesses to meta data for all the memory regions (e.g., "memory region_01" to "memory region_M").

In operation S720, the controller 200 may determine whether the number of accesses to the meta data is equal to or greater than a set reference value.

In an embodiment, the controller 200 may determine whether the total sum of the number of accesses to the meta data stored in the memory regions (e.g., "memory region_01" to "memory region_M") is equal to or greater than the first reference value.

In an embodiment, the controller 200 may determine whether the total sum of the number of accesses to the meta data stored in in each of the sub-regions (e.g., "sub region_01" to "sub region_09") for each of the memory regions "memory region_01" to "memory region_M" is equal to or greater than the second reference value.

In operation S730, when the number of accesses is equal to or greater than the set reference value, the controller 200 may perform the start-gap wear leveling operation.

In an embodiment, when the total sum of the number of accesses to the meta data included in the memory regions (e.g., "memory region_01" to "memory region_M") is equal to or greater than the first reference value, the controller 200 may perform the global start-gap wear leveling operation to migrate the meta data stored in the memory regions to on which the start-gap wear leveling operation is to be performed to a spare region.

In an embodiment, when the total sum of the number of accesses to the meta data included in each of the sub-memory regions (e.g., "sub region_01" to "sub region_09") for each of the memory regions (e.g., "memory region_01" to "memory region_M") is equal to or more than the second reference value, the controller 200 may migrate the meta data stored in the sub-memory regions on which the start-gap wear leveling operation is to be performed to a sub spare region.

In operation S720, when the total sum of the number of accesses is less than the set reference value, the controller 200 may return to operation S710.

Figure 8:
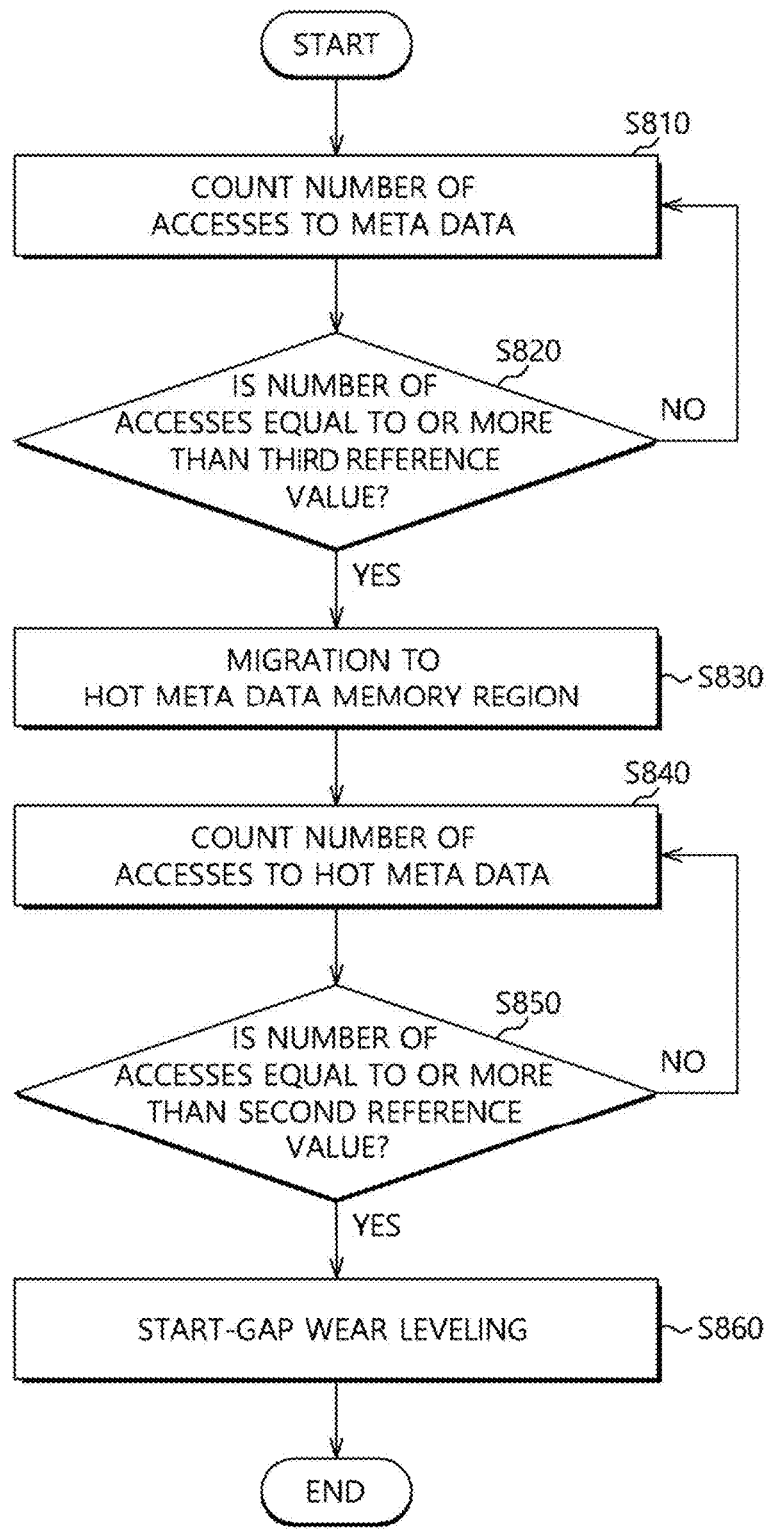

FIG. 8 is a flowchart for describing the start-gap wear leveling operation of the second memory in accordance with an embodiment of the present disclosure.

Referring to FIG. 8, in operation S810, the controller 200 may count the number of accesses to meta data stored in each sub-meta region of each cold meta region among a plurality of memory regions included in the second memory 240. In an embodiment, the controller 200 may count the total sum of the number of accesses to each sub-meta region included in each of the cold meta regions and the number of accesses to each of the cold meta regions.

In operation S820, the controller 200 may determine whether the number of accesses to meta data stored in each sub-meta region of the cold meta regions is equal to or greater than the third reference value. In an embodiment, when it is detected that the total sum of the number of accesses for a cold meta region is equal to or more than the first set value, the controller 200 may check whether a sub-meta region, in which the number of accesses to the sub-meta region in the cold meta region is equal to or more than the third reference value (=first set value*$\alpha$, $\alpha$ is a real number where 0<$\alpha$<1), is detected, among sub-meta regions in the cold meta region.

In operation S830, the controller 200 may migrate meta data, to which the number of accesses is equal to or greater than the third reference value among the meta data stored in the sub-meta regions of the cold meta regions, to a hot meta region.

In operation S840, the controller 200 may count the total sum of the number of accesses to meta data stored in the hot meta region.

In operation S850, when the total sum of the number of accesses to the meta data stored in the hot meta region is equal to or greater than the second reference value, the controller 200 may perform the start-gap wear leveling operation on the meta data stored in the sub-region where the start-gap wear leveling operation is to be performed, for example, the local start-gap wear leveling operation, at operation S860.

While various embodiments have been described above, it will be understood to those skilled in the art that the embodiments described are examples only. Accordingly, the controller and the operating method thereof described herein should not be limited based on the described embodiments.

Figure 9:
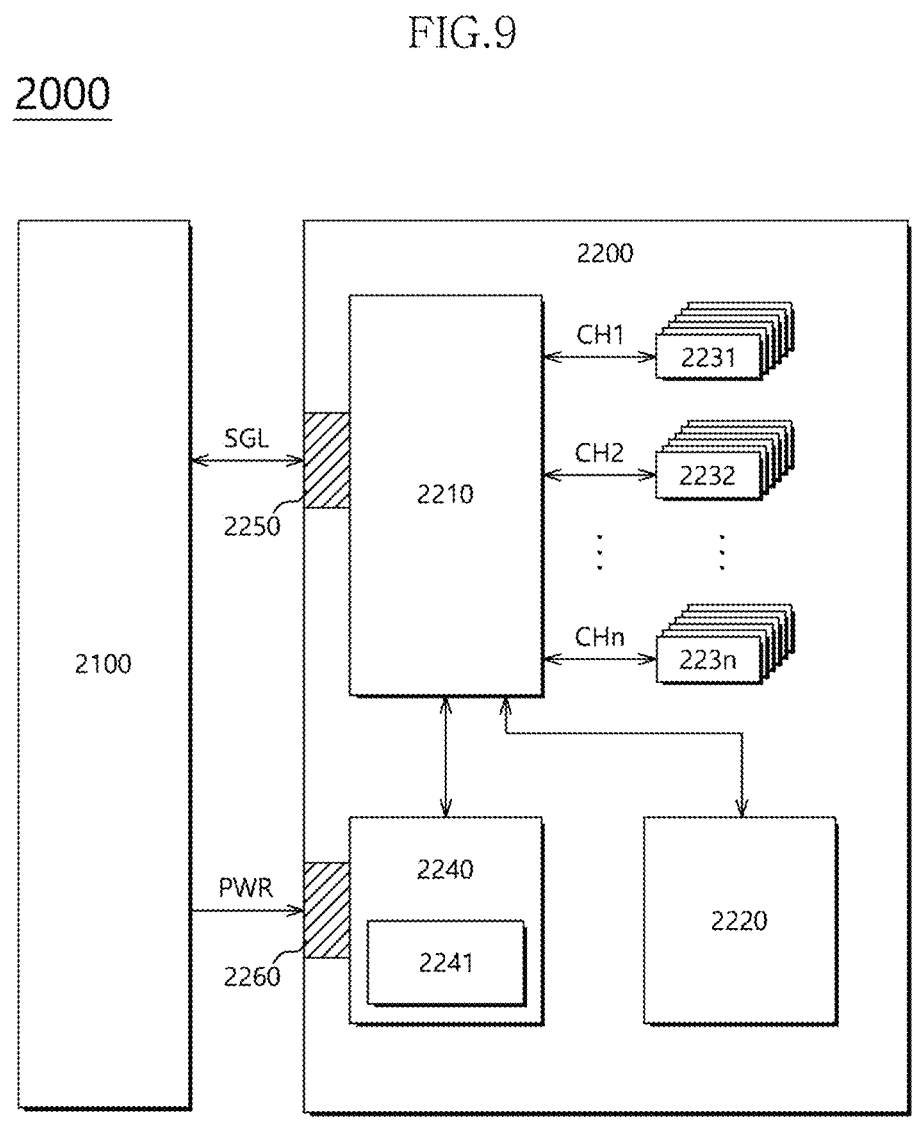
FIG. 9 is a diagram illustrating a data processing system including a solid-state drive (SSD) in accordance with an embodiment of the present disclosure.

FIG. 9 is a diagram illustrating a configuration of a data processing system including a solid state drive (SSD) in accordance with an embodiment of the present disclosure. Referring to FIG. 9, a data processing system 2000 may include a host 2100 and a solid state drive (SSD) 2200.

The SSD 2200 may include a controller 2210, a buffer memory device 2220, nonvolatile memory devices 2231 to 223n, a power supply 2240, a signal connector 2250, and a power connector 2260.

The controller 2210 may control overall operation of the SSD 2200. The controller 2210 may be implemented and operate in substantially the same way as the controller 200 of FIG. 1.

The buffer memory device 2220 may temporarily store data to be stored in the nonvolatile memory devices 2231 to 223n. Further, the buffer memory device 2220 may temporarily store data read from the nonvolatile memory devices 2231 to 223n. The data temporarily stored in the buffer memory device 2220 may be transmitted to the host 2100 or the nonvolatile memory devices 2231 to 223n according to control of the controller 2210.

The nonvolatile memory devices 2231 to 223n may be used as storage media of the SSD 2200. The nonvolatile memory devices 2231 to 223n may be electrically coupled to the controller 2210 through a plurality of channels CH1 to CHn, respectively. One or more nonvolatile memory devices may be coupled to a single channel. The nonvolatile memory devices coupled to a single channel may be coupled to the same signal bus and data bus.

The power supply 2240 may provide power to the inside of the SSD 2200, with power PWR inputted through the power connector 2260. The power supply 2240 may include an auxiliary power supply 2241. The auxiliary power supply 2241 may supply power to allow the SSD 2200 to be properly terminated when sudden power-off (SPO) occurs. The auxiliary power supply 2241 may include large capacity capacitors capable of charging the power PWR.

The controller 2210 may exchange a signal SGL with the host 2100 through the signal connector 2250. The signal SGL may include a command, an address, data, and the like. The signal connector 2250 may be configured as any of various types of connectors according to an interface scheme between the host 2100 and the SSD 2200.

Figure 10:
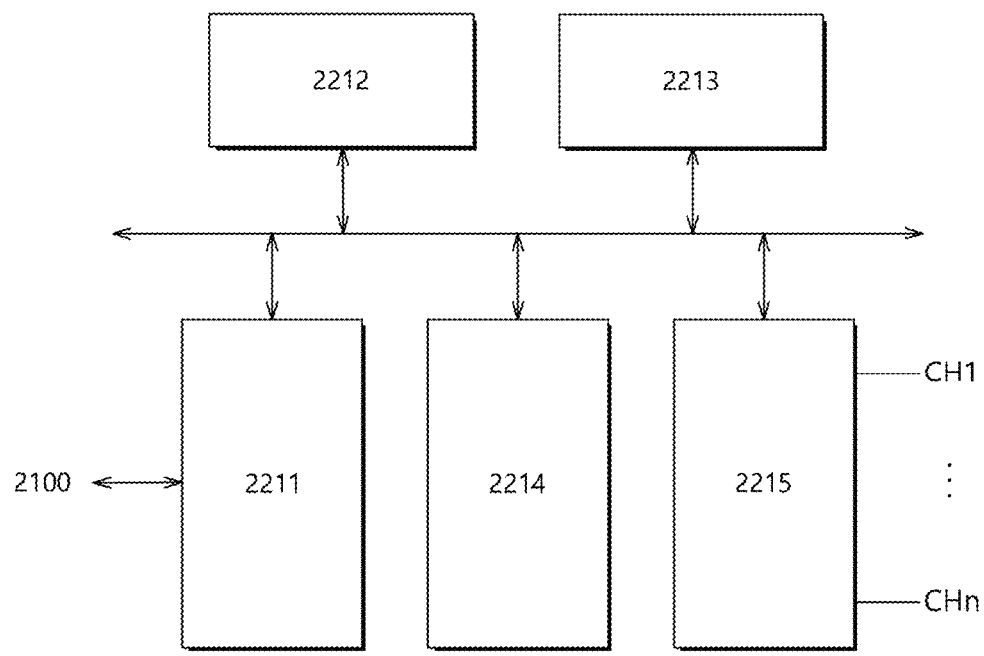
FIG. 10 is a diagram illustrating a configuration of a controller, such as that illustrated in FIG. 9.

FIG. 10 is a diagram illustrating a configuration of the controller illustrated in FIG. 9. Referring to FIG. 10, the controller 2210 may include a host interface 2211, a control component 2212, a random access memory 2213, an error correction code (ECC) component 2214, and a memory interface 2215.

The host interface 2211 may perform interfacing between the host 2100 and the SSD 2200 according to a protocol of the host 2100. For example, the host interface 2211 may communicate with the host 2100 through any of the following protocols: secure digital (SD), universal serial bus (USB), multi-media card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI Express (PCI-E), and/or universal flash storage (UFS). In addition, the host interface 2211 may perform a disk emulating function of supporting the host 2100 to recognize the SSD 2200 as a general-purpose memory system, for example, a hard disk drive (HDD).

The control component 2212 may parse and process the signal SGL provided from the host 2100. The control component 2212 may control operations of internal function blocks according to firmware or software for driving the SSD 2200. The random access memory 2213 may operate as a working memory for driving such firmware or software.

The ECC component 2214 may generate parity data for data to be transmitted to the nonvolatile memory devices 2231 to 223n. The generated parity data may be stored, along with the data, in the nonvolatile memory devices 2231 to 223n. The ECC component 2214 may detect errors of data read out from the nonvolatile memory devices 2231 to 223n based on the parity data. When the detected errors are within a correctable range, the ECC component 2214 may correct the detected errors.

The memory interface 2215 may provide control signals such as commands and addresses to the nonvolatile memory devices 2231 to 223n according to control of the control component 2212. The memory interface 2215 may exchange data with the nonvolatile memory devices 2231 to 223n according to control of the control component 2212. For example, the memory interface 2215 may provide data stored in the buffer memory device 2220 to the nonvolatile memory devices 2231 to 223n or provide data read from the nonvolatile memory devices 2231 to 223n to the buffer memory device 2220.

Figure 11:
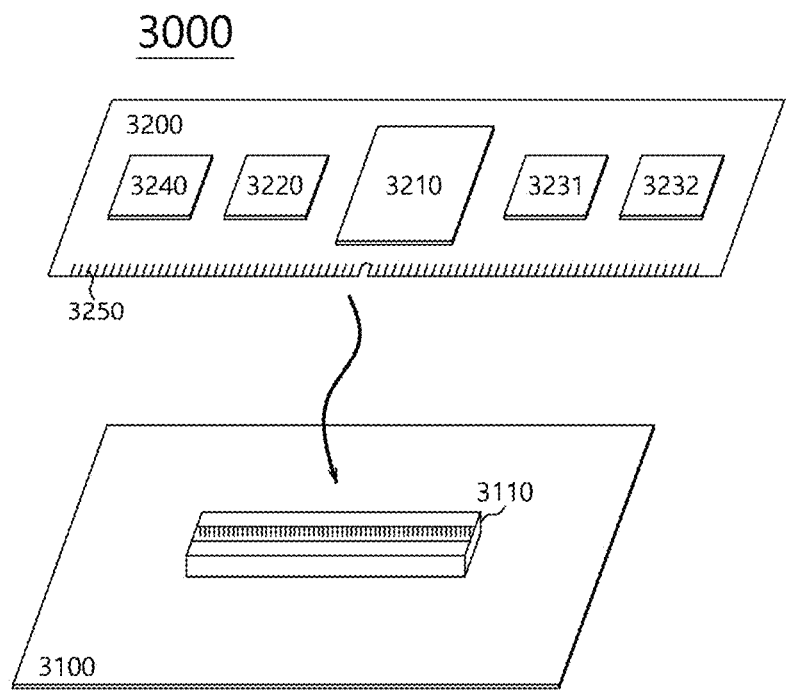
FIG. 11 is a diagram illustrating a configuration of a data processing system including a memory system in accordance with an embodiment of the present disclosure.

FIG. 11 is a diagram illustrating a configuration of a data processing system including a memory system in accordance with an embodiment of the present disclosure. Referring to FIG. 11, a data processing system 3000 may include a host 3100 and a memory system 3200.

The host 3100 may be configured in the form of a board such as a printed circuit board. Although not shown in FIG. 11, the host 3100 may include internal function blocks for performing functions of a host.

The host 3100 may include a connection terminal 3110 such as a socket, a slot, or a connector. The memory system 3200 may be mounted on the connection terminal 3110.

The memory system 3200 may be configured in the form of a board such as a printed circuit board. The memory system 3200 may be referred to as a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control overall operation of the memory system 3200. The controller 3210 may be configured in substantially the same manner as the controller 2210 shown in FIG. 10.

The buffer memory device 3220 may temporarily store data to be stored in the nonvolatile memory devices 3231 and 3232. Further, the buffer memory device 3220 may temporarily store data read out from the nonvolatile memory devices 3231 and 3232. The data temporarily stored in the buffer memory device 3220 may be transmitted to the host 3100 or the nonvolatile memory devices 3231 and 3232 according to control of the controller 3210.

The nonvolatile memory devices 3231 and 3232 may be used as storage media of the memory system 3200.

The PMIC 3240 may provide power to the inside of the memory system 3200, with power inputted through the connection terminal 3250. The PMIC 3240 may manage the power of the memory system 3200 according to control of the controller 3210.

The connection terminal 3250 may be electrically coupled to the connection terminal 3110 of the host 3100. Through the connection terminal 3250, signals such as commands, addresses, data and the like, and power may be transferred between the host 3100 and the memory system 3200. The connection terminal 3250 may be configured as any of various types depending on an interface scheme between the host 3100 and the memory system 3200. The connection terminal 3250 may be disposed on or in any side of the memory system 3200.

Figure 12:
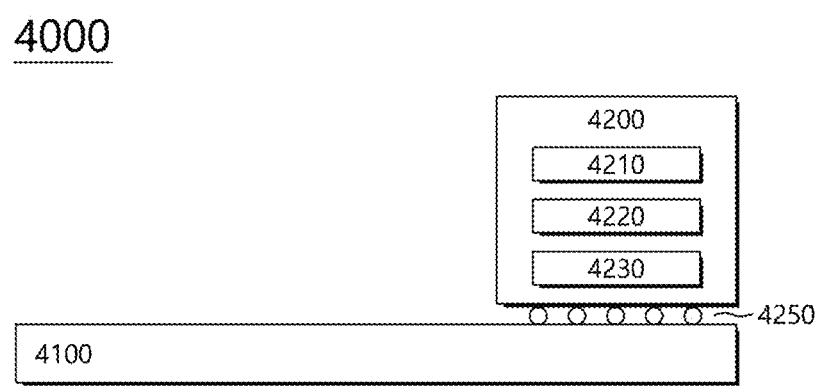
FIG. 12 is a diagram illustrating a configuration of a data processing system including a memory system in accordance with an embodiment of the present disclosure.

FIG. 12 is a diagram illustrating a configuration of a data processing system including a memory system in accordance with an embodiment of the present disclosure. Referring to FIG. 12, the data processing system 4000 may include a host 4100 and a memory system 4200.

The host 4100 may be configured in the form of a board such as a printed circuit board. Although not shown in FIG. 12, the host 4100 may include internal function blocks for performing functions of a host.

The memory system 4200 may be configured in the form of a package of a surface-mounting type. The memory system 4200 may be mounted on the host 4100 through solder balls 4250. The memory system 4200 may include a controller 4210, a buffer memory device 4220, and a nonvolatile memory device 4230.

The controller 4210 may control overall operation of the memory system 4200. The controller 4210 may be configured in substantially the same manner as the controller 2210 shown in FIG. 10.

The buffer memory device 4220 may temporarily store data to be stored in the nonvolatile memory device 4230. Further, the buffer memory device 4220 may temporarily store data read out from the nonvolatile memory device 4230. The data temporarily stored in the buffer memory device 4220 may be transmitted to the host 4100 or the nonvolatile memory device 4230 according to control of the controller 4210.

The nonvolatile memory device 4230 may be used as a storage medium of the memory system 4200.

Figure 13:
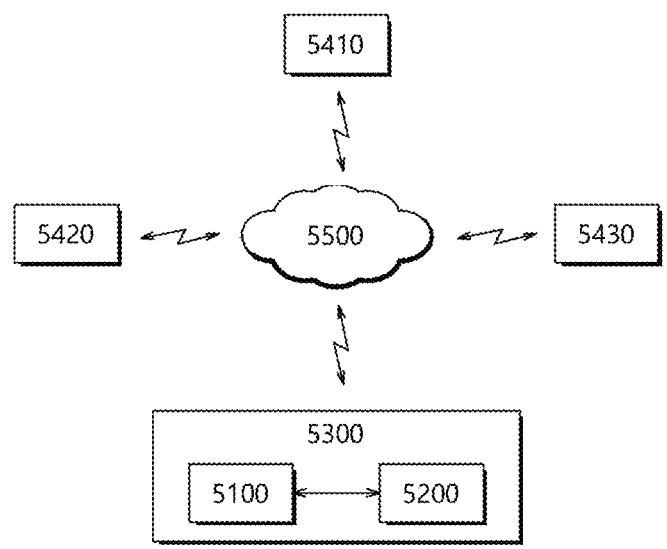
FIG. 13 is a diagram illustrating a configuration of a network system including a memory system in accordance with an embodiment of the present disclosure.

FIG. 13 is a diagram illustrating a configuration of a network system 5000 including a memory system in accordance with an embodiment of the present disclosure. Referring to FIG. 13, the network system 5000 may include a server system 5300 and a plurality of client systems 5410 to 5430 which are electrically coupled to each other through a network 5500.

The server system 5300 may service data in response to requests from the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host 5100 and a memory system 5200. The memory system 5200 may be configured as the memory system 10 illustrated in FIG. 1, the memory system 2200 illustrated in FIG. 9, the memory system 3200 illustrated in FIG. 10, or the memory system 4200 illustrated in FIG. 11.

Figure 14:
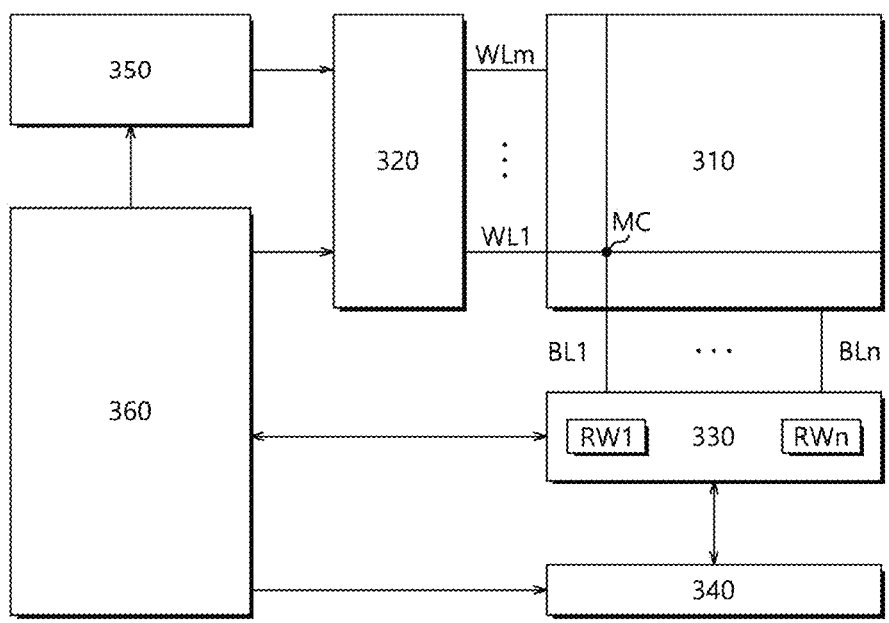
FIG. 14 is a block diagram illustrating a nonvolatile memory device included in a memory system.

FIG. 14 is a block diagram illustrating a nonvolatile memory device 300 included in a memory system in accordance with an embodiment of the present disclosure. Referring to FIG. 14, the nonvolatile memory device 300 may include a memory cell array 310, a row decoder 320, a data read/write block 330, a column decoder 340, a voltage generator 350, and a control logic 360.

The memory cell array 310 may include memory cells MC 1o which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may 1o couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

The above described embodiments of the present teachings are intended to illustrate and not to limit the present teachings. Various alternatives and equivalents are possible. The present teachings not limited by the embodiments described herein. Nor are the present teachings limited to any specific type of semiconductor device. Other additions, subtractions, or modifications are obvious in view of the present disclosure and are intended to fall within the scope of the appended claims.

What is claimed is:

1. A controller that controls a nonvolatile memory apparatus, comprising:
   a first memory configured to temporarily store user data;
   a second memory including a plurality of memory regions composed of one or more meta regions for storing meta data and at least one spare region; and
   a processor configured to control the first memory and the second memory and perform first start-gap wear leveling on at least one meta region using the at least one spare region as a gap,
   wherein the processor performs the first start-gap wear leveling by moving the meta data of the at least one meta region to the at least one spare region when a total sum of a number of accesses to the meta data is equal to or more than a first reference value.

2. The controller according to claim 1,
   wherein each of the one or more meta regions includes a plurality of sub-regions composed of one or more sub-meta regions for storing the meta data and at least one sub-spare region, and
   wherein the processor further performs second start-gap wear leveling on at least one sub-meta region using the at least one sub-spare region as a gap.

3. The controller according to claim 2, wherein the processor performs the second start-gap wear leveling by moving the meta data of the at least one sub-meta region to the at least one sub-spare region when a total sum of a number of accesses to the meta data stored in the sub-meta regions for each meta region is equal to or more than a second reference value.

4. The controller according to claim 2,
   wherein each of the one or more meta regions include a cold meta region and a hot meta region, and
   wherein the processor migrates the meta data, to which a number of accesses is equal to or greater than a third reference value among meta data stored in the cold meta region, to the hot meta region, and performs the second start-gap wear leveling on the hot meta region.

5. The controller according to claim 4, wherein, when it is detected that a total sum of a number of accesses for a cold data region is equal to or more than a first set value the processor is configured to migrate, to the hot meta region, meta data of a sub-meta region in which a number of accesses is equal to or more than the third reference value among sub-meta regions in the detected cold meta region.

6. The controller according to claim 1, wherein the first memory has a larger data storage capacity than the second memory.

7. The controller according to claim 1, wherein the first memory has a higher data processing speed than the second memory.

8. The controller according to claim 1, wherein the first memory is a dynamic random access memory (DRAM) and the second memory is a phase-change random access memory (PCRAM).

9. An operating method of a controller including a first memory configured to temporarily store user data and a second memory including a plurality of memory regions composed of one or more meta regions for storing meta data and at least one spare region, the operating method comprising:
   determining whether a number of accesses to at least one meta region, where the meta data is stored, is equal to or greater than a first predetermined value; and
   performing first start-gap wear leveling on the at least one meta region using the at least one spare region as a gap when a total sum of the number of accesses to the meta data is equal to or more than a first reference value,
   wherein the performing of the first start-gap wear leveling comprises moving the meta data of the at least one meta region to the at least one spare region.

10. The operating method according to claim 9,
    wherein each of the one or more meta regions includes a plurality of sub-regions composed of one or more sub-meta regions for storing the meta data and at least one sub-spare region, and
    further comprising:
    determining whether a total sum of a number of accesses to the meta data stored in each of the sub-meta regions is equal to or greater than a second reference value; and
    performing second start-gap wear leveling on at least one sub-meta region using the at least one sub-spare region as a gap when the total sum of the number of accesses is equal to or more than the second reference value.

11. The operating method according to claim 10, wherein the performing of the second start-gap wear leveling comprises moving the meta data of the at least one sub-meta region to the at least one sub-spare region.

12. The operating method according to claim 10,
    wherein each of the one or more meta regions includes a cold meta region and a hot meta region, and
    further comprising:
    migrating the meta data to which a number of accesses is equal to or greater than a third reference value among meta data stored in the cold meta region, to the hot meta region; and
    performing the second start-gap wear leveling on the hot meta region.

13. The operating method according to claim 12, wherein the migrating of the meta data comprises:
    detecting a cold meta region where the total sum of a number of accesses is equal to or more than a first set value; and
    migrating, to the hot meta region, meta data of a sub-meta region where a number of accesses is equal to or more than the third reference value among sub-meta regions in the detected cold meta region.

14. The system according to claim 12,
    wherein the data memory region includes a cold data region and a hot data region, and
    the controller is further configured to shift a third data pieces in which a number of accesses is equal to or more than a third reference value among the data spaces to flock within to the hot data region, when it is detected that the total sum of the number of accesses to the data memory region is less than the first reference value.

15. A system comprising:
    a data memory region having one or more data spaces each configured to store a data piece;
    a spare memory region having one or more spare spaces each configured to store a data piece; and
    a controller configured to:
    shift first data pieces stored in one or more among the data spaces to flock within the data memory region, when a total sum of a number of accesses to the first data piece is equal to or more than a first reference value, and
    migrate a second data piece from one among the data space to spare space, when a total sum of the number of accesses to the second data piece is equal to or more than a second reference value.

* * * * *